US010243572B2

(12) United States Patent
Reddy (10) Patent No.: US 10,243,572 B2
(45) Date of Patent: *Mar. 26, 2019

(54) HYBRID PHASE LOCKED LOOP HAVING WIDE LOCKING RANGE

(71) Applicant: Microsemi SoC Corporation, San Jose, CA (US)

(72) Inventor: Prakash Reddy, Hyderabad (IN)

(73) Assignee: Microsemi SoC Corporation, San Jose, CA (US)

( * ) Notice: Subject to any disclaimer, the term of this patent is extended or adjusted under 35 U.S.C. 154(b) by 190 days.

This patent is subject to a terminal disclaimer.

(21) Appl. No.: 15/364,167

(22) Filed: Nov. 29, 2016

(65) Prior Publication Data

US 2017/0085273 A1   Mar. 23, 2017

Related U.S. Application Data (63) Continuation of application No. 15/047,778, filed on Feb. 19, 2016, now Pat. No. 9,515,669.

(30) Foreign Application Priority Data

Mar. 23, 2015   (IN) ............................ 962/MUM/2015

(51) Int. Cl.
*H03L 7/00* (2006.01)
*H03L 7/10* (2006.01)
(Continued)

(52) U.S. Cl.
CPC ................ *H03L 7/103* (2013.01); *H03L 7/00* (2013.01); *H03L 7/087* (2013.01); *H03L 7/093* (2013.01); *H03L 7/099* (2013.01); *H03L 7/0991* (2013.01)

(58) Field of Classification Search
CPC . H03L 7/00; H03L 7/087; H03L 7/099; H03L 7/0991; H03L 7/093; H03L 7/103
(Continued)

(56) References Cited

U.S. PATENT DOCUMENTS 5,610,954 A   3/1997 Miyashita
5,796,392 A   8/1998 Eglit
(Continued)

OTHER PUBLICATIONS

European Patent Office, International Search Report issued in PCT/US2016/018701, dated Jun. 9, 2016, 4 pages.
(Continued)

*Primary Examiner* — Arnold M Kinkead
(74) *Attorney, Agent, or Firm* — Glass & Associates; Kenneth D'Alessandro; Kenneth Glass (57) ABSTRACT

A digital phased lock loop includes a digital controlled oscillator configured to produce an output signal at an output signal frequency, and a phase comparator configured to compare the output signal or a signal derived from the output signal, with a reference signal at a reference signal frequency or a signal derived from the reference signal to produce a phase error signal. A first loop filter produces a first control signal for the digital controlled oscillator. A frequency error measuring circuit produces a frequency error signal that directly represents a frequency difference between the output signal frequency and the reference signal frequency. A second loop filter produces a second control signal for the digital controlled oscillator from an output of the frequency error measuring circuit. A circuit combines the first and second control signals and providing the combined control signals to the digital controlled oscillator.

8 Claims, 5 Drawing Sheets

(51) Int. Cl.
  *H03L 7/087* (2006.01)
  *H03L 7/093* (2006.01)
  *H03L 7/099* (2006.01)

(58) Field of Classification Search
  USPC .................. 331/16, 17, 34, 1 A; 327/159
  See application file for complete search history.

(56) References Cited

U.S. PATENT DOCUMENTS

| | | | |
|---|---|---|---|
| 6,118,836 | A | 9/2000 | Dove |
| 6,147,530 | A | 11/2000 | Nogawa |
| 6,489,851 | B1 | 12/2002 | Miyada |
| 7,554,412 | B2 | 6/2009 | Kojima |
| 8,598,929 | B1 | 12/2013 | Wicpalek et al. |
| 9,515,669 | B2 * | 12/2016 | Reddy .................... H03L 7/087 |
| 2007/0018733 | A1 | 1/2007 | Wang et al. |
| 2010/0213993 | A1 | 6/2010 | Hongo |
| 2011/0148488 | A1 | 6/2011 | Lee et al. |
| 2013/0214834 | A1 | 8/2013 | Wen |
| 2016/0094334 | A1 | 3/2016 | Rahbar |

OTHER PUBLICATIONS

European Patent Office, Written Opinion issued in PCT/US2016/018701, dated Jun. 9, 2016, 6 pages.
Chen-Feng Chen, et al., "The Implementation of an Adaptive Bandwidth All-Digital Phase-Locked Loop," Yuan-Ze University, Department of Communications Engineering, Taiwan, 4 pages.
Anitha Babu, et al., "All Digital Phase Locked Loop Design and Implementation," University of Florida, Gainesville, FL, pp. 1-4.
Christian Venerus, et al., "A TDC-Free Mostly-Digital FDC-PLL Frequency Synthesizer With a 2.8-3.5 GHz DCO," IEEE Journal of Solid-State Circuits, vol. 50, No. 2, Feb. 2015, pp. 450-463.
Dian Huang, et al., "A Fast-Locked All-Digital Phase-Locked Loop for Dynamic Frequency Scaling," pp. 1-6.
Dan Hu, Thesis entitled, "FPGA-Based Digital Phase-Locked Loop Analysis and Implementation," University of Illinois, 2011, 51 pages.

* cited by examiner

HYBRID PHASE LOCKED LOOP HAVING WIDE LOCKING RANGE

CROSS-REFERENCE TO RELATED APPLICATIONS

This application is a continuation of U.S. patent application Ser. No. 15/047,778, filed Feb. 19, 2016, which claims priority from Indian Patent Application No. 962/MUM/2015, filed Mar. 23, 2015, the contents of which are incorporated in this disclosure by reference in their entirety.

BACKGROUND

Prior art phased lock loops (PLLs) use measurement of the phase difference between a reference signal and the feedback signal, after frequency division, to adjust the frequency of a digitally controlled oscillator that generates the feedback signal. A frequency division can be employed in the reference signal and/or the feedback signal before prior to phase error measurement.

A digital phase locked loop (DPLL) in general comprises a phase comparator, a loop filter, a digital controlled oscillator, and a feedback path. The feedback signal is compared with a reference signal to generate an error signal. The loop filter filters the error signal to generate the control signal for the digital controlled oscillator. In this way the output of the phase locked loop is locked to the reference signal. The convergence time is the time it takes for the output to lock on to the reference signal and is proportional to the filter bandwidth. A low filter bandwidth is desirable to reduce jitter but this implies a long convergence time.

In one type of DPLL, known as a type II PLL, the loop filter is of second order. The loop filter has two parts, known as the proportional or P-part, and integral I-part, which generate corresponding components of the DCO frequency control signal. The I-part accumulates the phase errors into a frequency offset, which is added to the instantaneous phase from the P-part in each cycle. The convergence time is normally dominated by the P-part. However, when the frequency is in lock with the reference signal and the I-part has a small frequency offset, the residual phase convergence time is governed by the small error from the I-part. Under these circumstances the phase error can be corrected extremely slowly, especially when the loop bandwidth is low.

Figure 1:
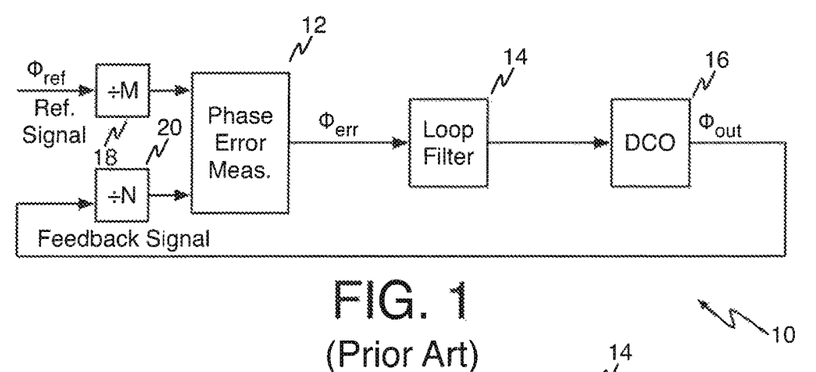
FIG. 1 is a block diagram of a typical prior-art DPLL.

A typical type II DPLL 10, shown in FIG. 1, comprises a phase comparator 12 to measure phase error, a loop filter 14, and a digital controlled oscillator (DCO) 16. The phase comparator 12 compares the phase of a reference clock Φref (or a reference clock divided by 1/M in frequency divider 18) and the output of the local DCO 16 or some derivative thereof, for example, a fraction thereof (through frequency divider 20), potentially with some preset offset, with the phase error Φerr being the output of phase comparator 12. It will be understood that the DPLL 10 operates under the control of a system clock (not shown).

Figures 2, 3:
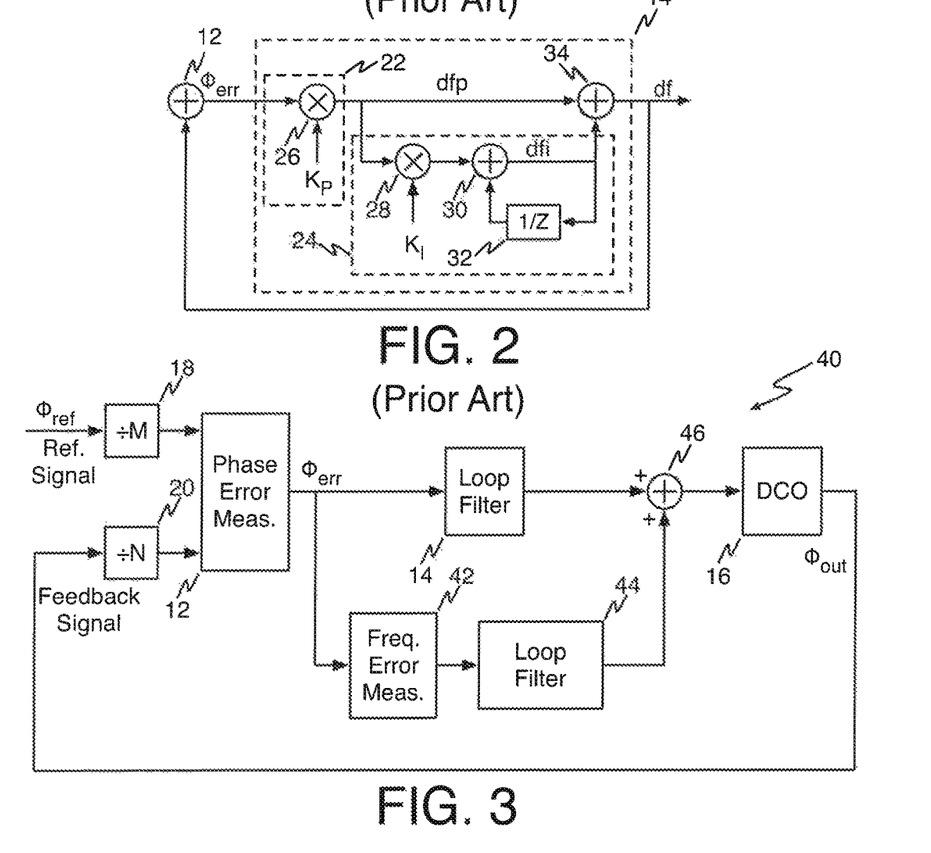
FIG. 2 is a block diagram of a typical loop filter used in the phase correction loop of a DPLL of the prior art.
FIG. 3 is a block diagram of a phase locked loop in accordance with the principles of the present invention.

A typical loop filter 14 includes a proportional (P) component 22 and an integral (I) component 24, as shown in FIG. 2. In the proportional (P) component 22 of loop filter 14, multiplier 26 multiplies the output Φerr of a phase comparator used as the phase error measurement element 12 by the scaling factor $K_P$. The output of multiplier 26 is provided to the integral (I) component 24 including multiplier 28 having the integral factor $K_I$ as an input. An integrator consisting of adder 30 and memory 32 with a unit delay forms part of a delayed feedback loop. The multiplier 26 produces a phase compensation component dfp and the multiplier 28 and integrator (adder 30 and memory 32) produce an integral component dfi, representing a frequency offset relative to the frequency of the reference clock Φref. The components dfp and dfi are further summed in adder 34 to produce a control signal df which is arranged to set the frequency of the DCO 16 of FIG. 1 so that it becomes locked to the reference clock Φref.

The memory 32 stores the value of the frequency component dfi for one cycle so that the current inputs to the adder 30 are (previous cycle dfi)+$K_I$*dfp (current cycle). Consequently the DCO control signal df at the output of the adder 34 is given by df=dfp (current cycle)+dfi (previous cycle)+$K_I$*dfP (current cycle).

The loop bandwidth is generally set by user and is determined by the scaling factor $K_P$, which is typically set to be: $K_P$=2πf/fsys, where f is the loop bandwidth and fsys is the system clock frequency for the DPLL 10. The multiplier 26 will give an instantaneous PLL update value dfp, since there is no memory component. The integral factor $K_I$, which is input to the multiplier 28, maintains the filter integral part at a very low rate in relation to the instantaneous PLL update value dfp and in general: $K_I$=$K_P$/D, where D>>1 is a damping factor.

When phase difference is the only variable considered when correcting the frequency of the DCO, the locking range of the PLL is limited by the loop bandwidth. To increase the locking range the loop gain has to be increased which in turn increases the frequency noise in the output.

Therefore, there is a need for a new way to control a PLL which is not associated with these disadvantages.

SUMMARY

The present invention provides a method to increase the locking range of a PLL by providing an additional variable for frequency correction. The present invention measures the frequency difference between the reference signal and the feedback signal and uses an additional control loop to force the frequency difference to zero. The frequency difference is derived from phase error measurement. The frequency error is forced to zero by using an additional closed loop controller which can be as simple as a PI controller or a complex algorithm-based controller. By using the proposed method, the locking range of the PLL can be increased without increasing the loop gain of phase error based frequency adjustment.

According to one embodiment of the present invention, a digital phased locked loop includes a digital controlled oscillator configured to produce an output signal at a frequency. A phase comparator compares the output signal, or a signal derived therefrom, with a reference signal to produce a phase error signal. A first loop filter produces a first control signal for the digital controlled oscillator from an output of the phase comparator. A frequency error measuring circuit coupled to the output of the phase comparator produces a frequency error signal. A second loop filter produces a second control signal for the digital controlled oscillator from an output of the frequency error measuring circuit. A circuit combines the first and second control signals and provides the combined control signals to the digital controlled oscillator.

DRAWINGS

These and other features, aspects and advantages of the present invention will become better understood with regard to the following description, appended claims, and accompanying drawings where:

DESCRIPTION

Persons of ordinary skill in the art will realize that the following description of the present invention is illustrative only and not in any way limiting. Other embodiments of the invention will readily suggest themselves to such skilled persons.

A particular embodiment of the present invention is shown in FIG. 3, a block diagram of an illustrative DPLL 40 in accordance with the principles of the present invention. Certain ones of the components of DPLL 40 are similar in form and function to components in the prior-art DPLL 10 depicted in FIG. 1. These components will be referred to using the same reference numerals used to designate their counterparts in FIG. 1.

DPLL 40 includes a phase comparator 12, a phase loop filter 14, and a digital controlled oscillator (DCO) 16. Phase comparator 12 compares the phase of a reference clock Φref (or a reference clock divided by 1/M in frequency divider 18) and the output of the local DCO 16 or some derivative thereof, for example, a fraction thereof (through 1/N frequency divider 20), potentially with some preset offset, with the phase error Φerr being the output of phase comparator 12. It will be understood that the whole circuit operates under the control of a system clock (not shown).

Phase loop filter 14 includes a P component 14-22 and I component 14-24 similar to those depicted in FIG. 2, or any other prior art DPLL arrangement, including the DPLL taught in U.S. Pat. No. 6,236,343 issued May 22, 2001 to Patapoutian, entitled "Loop Latency Compensated PLL Filter", the entire contents of which is incorporated herein by reference. Irrespective of arrangement, the output of phase loop filter 14 comprises a signal which in the prior art is fed to DCO 16 to lock the output of DCO 16 to the reference signal.

Figure 4:
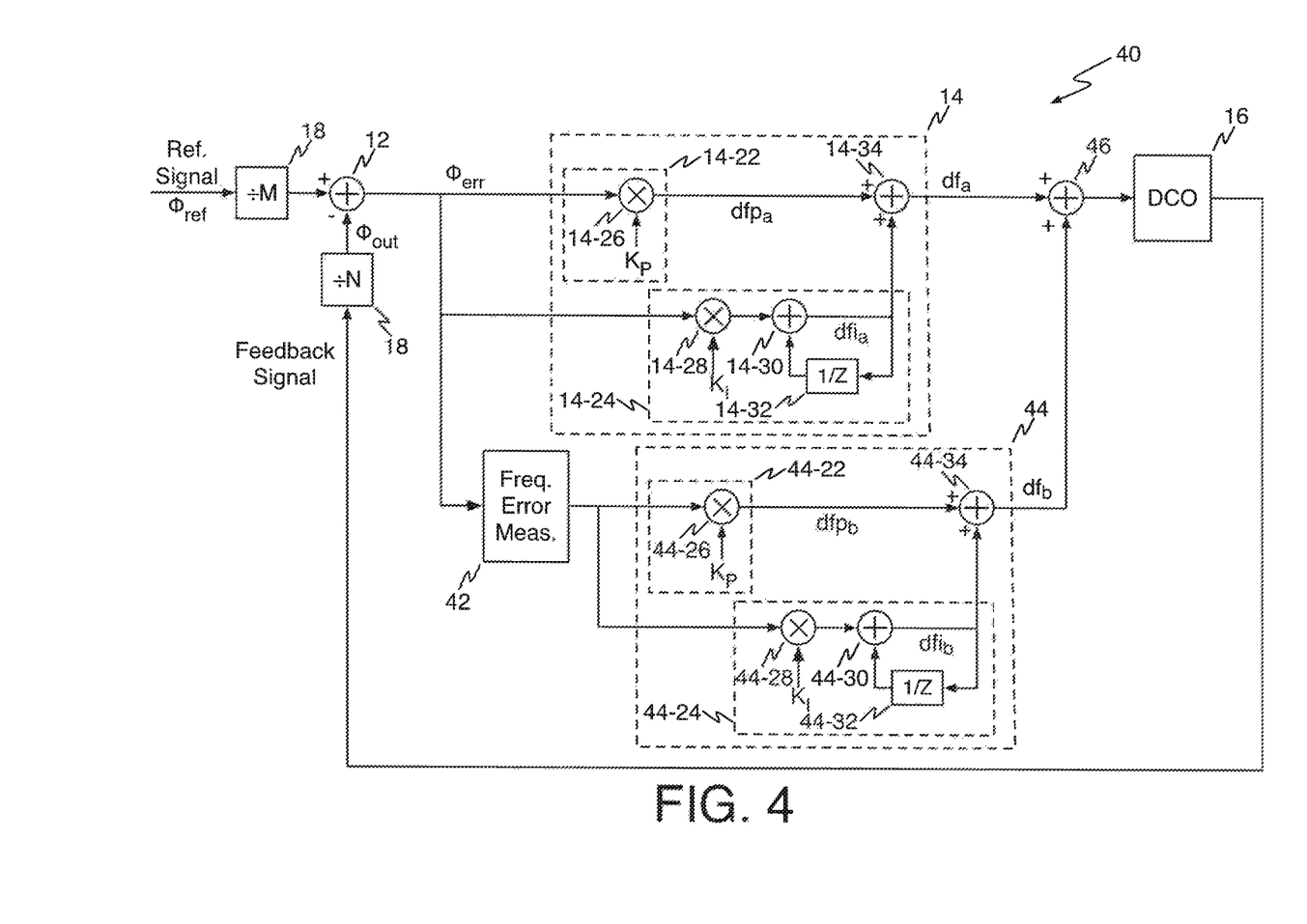
FIG. 4 is a diagram of the DPLL of FIG. 3, showing the loop filters in more detail.

Referring now to FIG. 4, in the P component of phase loop filter 14, multiplier 14-26 multiplies the output Φerr of the phase comparator that comprises phase error measurement element 12 by the scaling factor $K_P$. The phase error signal Φerr is further provided to the I component 14-24 including multiplier 14-28 having the integral factor $K_I$ as an input. An integrator consisting of adder 14-30 and memory 14-32 with a unit delay forms part of a delayed feedback loop. The multiplier 14-26 produces a phase compensation component $dfp_a$ and the multiplier 14-28 and integrator (adder 14-30 and memory 14-32) produce an integral component $dfi_a$, representing a phase offset relative to the reference clock Φref. The components $dfp_a$ and $dfi_a$ are further summed in adder 14-34 to produce a first control signal $df_a$ which is arranged to set the frequency of the DCO 14 so that it becomes locked in phase to the reference clock Φref.

The memory 14-32 stores the value of the frequency component $dfi_a$ for one cycle so that the current input $dfi_a$ to the adder 14-34 is (previous cycle $dfi_a$)+$K_I$*$dfp_a$ (current cycle). Consequently the first control signal dfa at the output of the adder 14-34 is given by $df_a$=$dfp_a$ (current cycle)+$dfi_a$ (previous cycle)+$K_I$*$dfp_a$ (current cycle).

The loop bandwidth for phase loop filter 14 is generally set by user and is determined by the scaling factor $K_P$, which is typically set to be: $K_P$=2πf/fsys, where f is the phase loop bandwidth and fsys is the system clock for the DPLL phase loop. The multiplier 14-22 will give an instantaneous PLL update value dfp. The scaling factor $K_I$, which is input to the multiplier 14-28, maintains the filter integral part at a very low rate in relation to the instantaneous PLL update value $dfp_a$ and in general: $K_I$=$K_P$/D, where D>>1 is a damping factor.

According to one aspect of the present invention, a second control loop for the DPLL 40 including frequency error measurement element 42 and frequency loop filter 44 corrects for frequency offset. Adder 46 combines the outputs of loop filter 16 and loop filter 42. The second control loop cooperates to improve locking when the frequency difference is larger than the phase loop bandwidth.

Frequency loop filter 44 includes a P component 44-22 and I component 44-24 similar to those of phase loop filter 14. In the P component of frequency loop filter 44, multiplier 44-26 multiplies the output of the frequency error measurement 42 by the scaling factor $K_P$. The frequency error signal is provided to the I component 44-24 including multiplier 44-28 having the integral factor $K_I$ as an input. An integrator consisting of adder 44-30 and memory 44-32 with a unit delay forms part of a delayed feedback loop. The multiplier 44-26 produces a frequency compensation component $dfp_b$ and the multiplier 44-28 and integrator (adder 44-30 and memory 44-32) produce an integral component $dfi_b$, representing a frequency offset relative to the frequency of the reference clock Φref. The components $dfp_b$ and $dfi_b$ are further summed in adder 44-34 to produce a second control signal $df_b$ which is arranged to set the frequency of the DCO 14 so that it becomes locked to the reference clock Φref.

The memory 44-32 stores the value of the frequency component $dfi_b$ for one cycle so that the current input $dfi_b$ to the adder 44-34 is (previous cycle $dfi_b$)+$K_I$*$dfp_b$ (current cycle). Consequently the second control signal $df_b$ at the output of the adder 44-34 is given by $df_b$=$dfp_b$ (current cycle)+$dfi_b$ (previous cycle)+$K_I$*$dfp_b$ (current cycle).

The loop bandwidth for frequency loop filter 44 is generally set by user and is determined by the integral factor $K_I$p. The multiplier 44-26 will give an instantaneous PLL update value dfp. The integral factor $K_I$, which is input to the multiplier 44-28, maintains the filter integral part at a very low rate in relation to the instantaneous PLL update value dfp and in general: $K_I$=$K_P$/D, where D>>1 is a damping factor.

The outputs of phase loop filter 14 and frequency loop filter 44 are summed in adder 46, to provide a combined control signal for DCO 14. The addition of second control signal dfb from frequency loop filter 44 allows the system to lock over a wider frequency range than would be possible if only phase loop filter 14 was used.

Figure 5A:
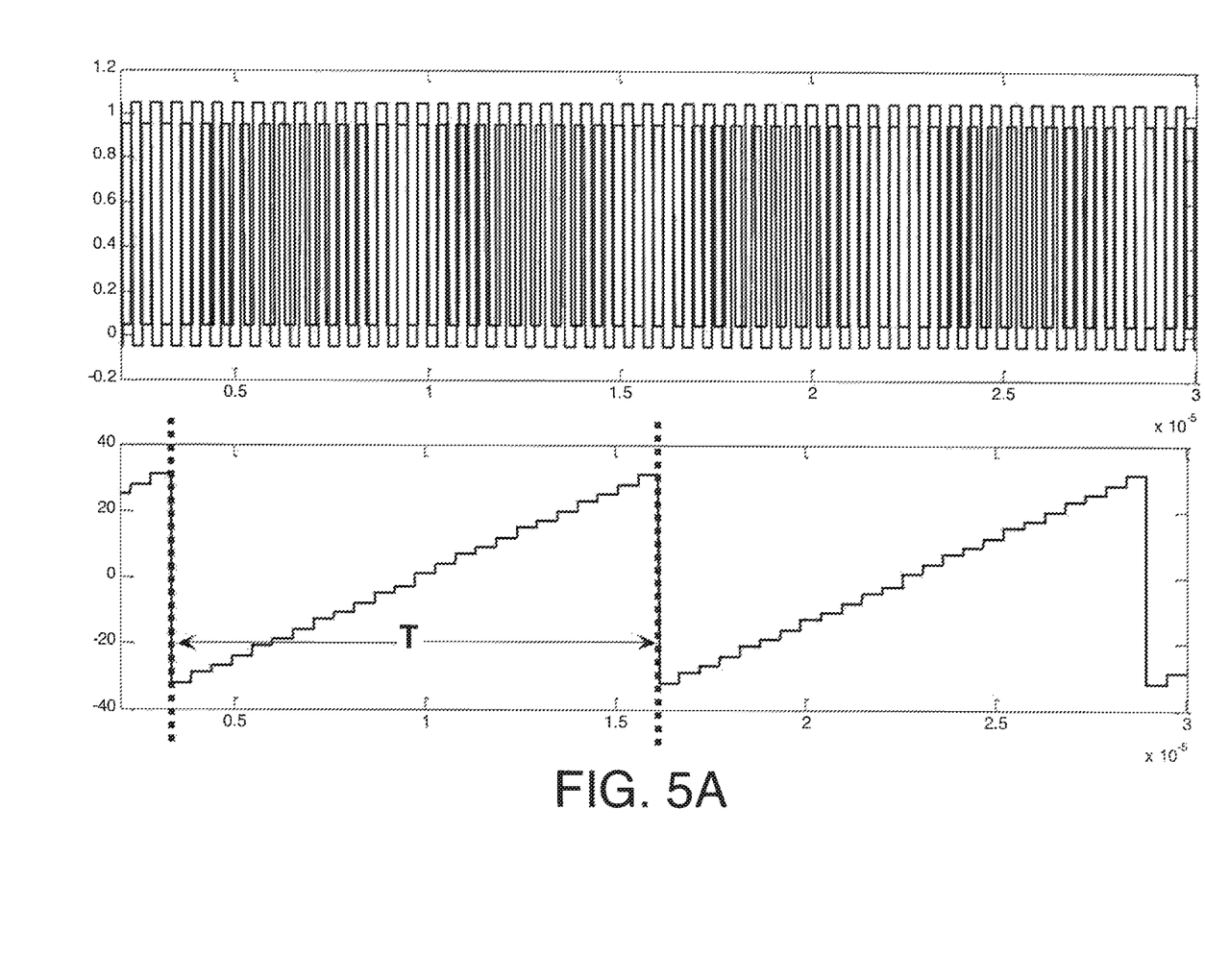
FIGS. 5A, 5B, and 5C are diagrams explaining the measurement of frequency from phase in accordance with one aspect of the present invention.
Figure 5B:
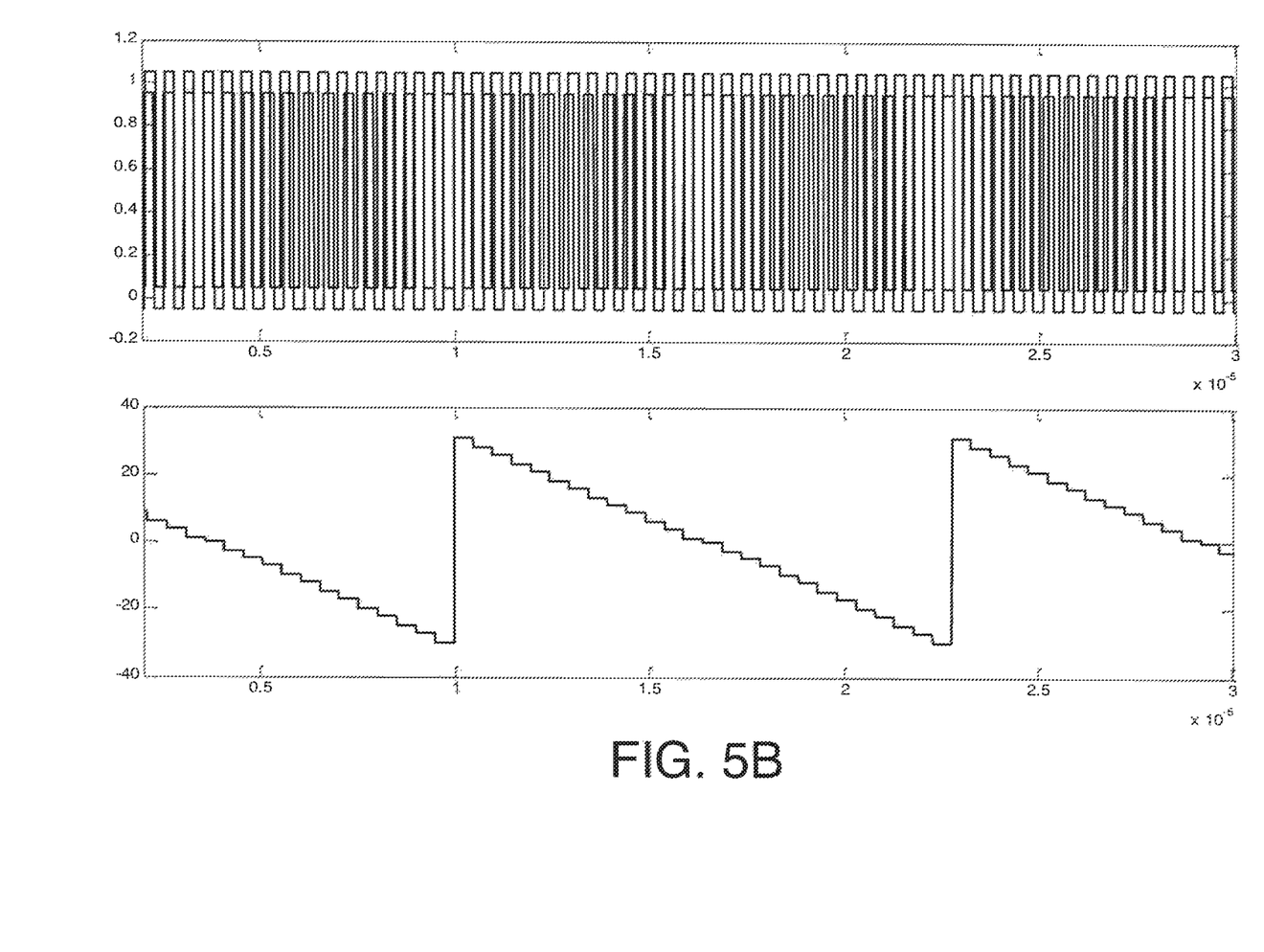
Figure 5C:
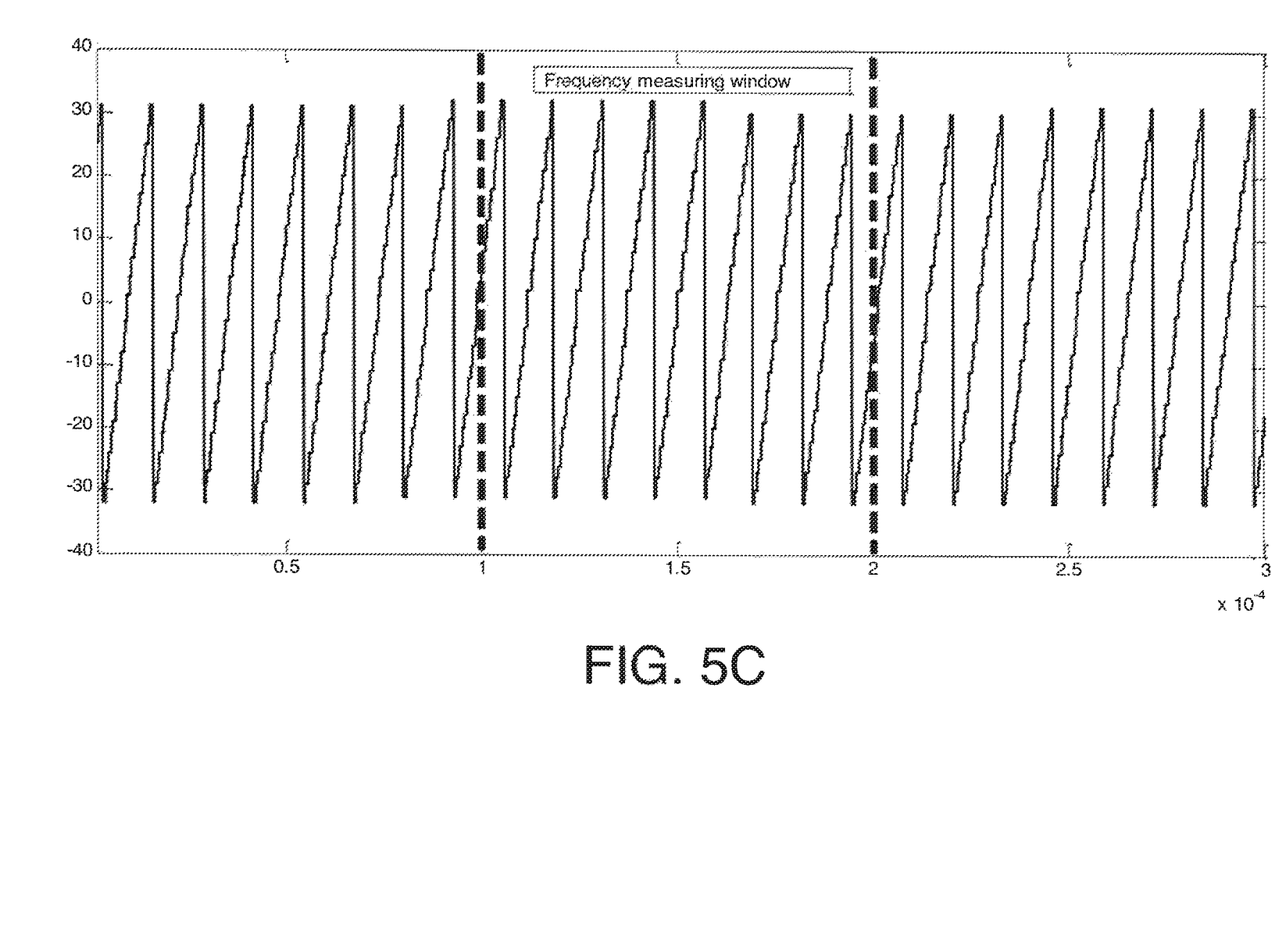

Referring now to FIGS. 5A, 5B, and 5C, diagrams explain the measurement of frequency from phase in accordance with one aspect of the present invention, as performed by frequency error measurement element 42. The upper trace in both FIGS. 5A and 5B show the reference frequency signal and the DCO output signal superimposed, the reference signal being the trace shown lower on the y-axis in the upper portions of FIGS. 5A and 5B. The lower of the two superimposed traces in both FIGS. 5A and 5B shows the phase difference between the reference frequency signal and the DCO output signal.

The phase difference between the reference signal and the feedback signal from the DCO is measured by counting the number of system clock cycles between the rising edge of the reference signal and the rising edge of the feedback signal. The measurement is performed after the optional frequency dividers 18 and 20. The phase difference measured this way has a different pattern when the feedback signal frequency is lower than that of reference signal (FIG. 5A) and when feedback signal frequency is higher than that of reference signal (FIG. 5B).

The periodicity of phase difference (number of cycles per second) directly represents the frequency difference between the reference clock signal Φref and the feedback signal. The frequency difference can be computed by measuring T as shown in FIG. 5A and calculating 1/T. This process involves a division which is resource and time consuming.

The frequency difference can also be found by counting the number of phase transitions in a fixed time window as shown in FIG. 5C. If the measuring window is 10 milliseconds and number of phase transitions are 8 then the frequency is 8/0.01=800, where 1/0.01 is a fixed factor and hence division is not required because both numerator and denominator can be multiplied by a number that makes the denominator equal to 1.

One way to find if the frequency difference is positive or negative is to find the difference between the present value of phase difference and the most immediately previous value of phase difference. If the difference is positive (except at transitions where difference value is too large and is not considered) then the frequency difference is positive. If the difference is negative, then the frequency difference is negative.

The addition of a loop filter for frequency raises the challenge of tuning two closed loop controllers to control a single system. However, by properly tuning the loop filters of the phase loop and the frequency loops the locking range of the PLL is increased by many times compared to the PLL of the prior art. The phase loop is preferably tuned such that the locking frequency range of the phase loop is equal to, or greater than, the frequency resolution (minimum frequency change that can be measured) of the error measurement element 42. Also the dynamic response of the frequency loop filter 44 should be slower than that of phase loop filter 14. The integrator in the frequency loop filter 44 plays a major role in defining its dynamics.

Although the present invention has been discussed in considerable detail with reference to certain preferred embodiments, other embodiments are possible. Therefore, the scope of the appended claims should not be limited to the description of preferred embodiments contained in this disclosure.

What is claimed is:

1. A digital phased lock loop comprising:
   a digital controlled oscillator generating an output signal at an output signal frequency or at a frequency derived from the output signal frequency;
   a phase comparator coupled to the digital controlled oscillator and to a reference signal at a reference signal frequency or a signal derived from the reference signal and generating a phase error signal derived from output signal and the reference signal;
   a first loop filter configured to produce a first control signal for the digital controlled oscillator from an output of the phase comparator;
   a frequency error measuring circuit coupled to the output of the phase comparator to produce a frequency error signal that directly represents a frequency difference between the output signal frequency and the reference signal frequency;
   a second loop filter generating a second control signal for the digital controlled oscillator from an output of the frequency error measuring circuit; and
   a circuit for combining the first and second control signals and providing the combined control signals to the digital controlled oscillator.

2. The digital phased lock loop of claim 1, wherein:
   the first loop filter comprises a proportional part producing a proportional component of the control signal, an integral part producing an integral component of the control signal, and an adder configured to receive the respective proportional and integral components at first and second inputs thereof to produce the control signal, the integral part including a delayed feedback loop normally configured to accept the integral component at an input thereof; and
   the second loop filter comprises a proportional part producing a proportional component of the control signal, an integral part producing an integral component of the control signal, and an adder configured to receive the respective proportional and integral components at first and second inputs thereof to produce the control signal, the integral part including a delayed feedback loop normally configured to accept the integral component at an input thereof.

3. The digital phase locked loop of claim 1, wherein:
   the delayed feedback loop in the first and second loop filters each comprise a unit delay memory.

4. The digital phase locked loop of claim 1, wherein:
   the frequency error measuring circuit is configured to count the number of phase transitions n in a fixed time window having an interval t, the frequency error signal being equal to n/t.

5. The digital phased lock loop of claim 1, wherein:
   the frequency error measuring circuit is configured to determine the periodicity of the phase difference between the output signal and the reference signal, the frequency error signal being equal to the inverse of the determined periodicity.

6. A method of reducing the convergence time in a digital phase locked loop, comprising:
   generating an output signal from a digitally controlled oscillator;
   comparing the output signal or a signal derived from the output signal with a reference signal or a signal derived from the reference signal to produce a phase error signal;
   filtering the phase error signal in a first loop filter having a proportional part producing a proportional component and an integral part producing an integral component, the integral part including a delayed feedback loop normally receiving at an input thereof the integral component;
   applying the proportional and integral components to respective first and second inputs of an adder to produce a first control signal;
   comparing the frequency of the output signal with the frequency of the reference signal, or a signal derived therefrom to produce a frequency error signal that directly represents frequency difference between the output signal frequency and the reference signal frequency;

filtering the frequency error signal in a second loop filter having a proportional part producing a proportional component and a integral part producing an integral component, the integral part including a delayed feedback loop normally receiving at an input thereof the integral component; and combining the first and second control signals and providing the combined control signals to the digital controlled oscillator.

7. The method of claim 6 wherein comparing the frequency of the output signal with the frequency of the reference signal, or a signal derived therefrom comprises:

counting the number of phase transitions n in a fixed time window having an interval t; and setting the frequency error signal equal to n/t.

8. The method of claim 6 wherein comparing the frequency of the output signal with the frequency of the reference signal, or a signal derived therefrom comprises:

determining the periodicity of the phase difference between the output signal and the reference signal; and setting the frequency error signal being equal to the inverse of the determined periodicity.

\* \* \* \* \*